(12) United States Patent
Kim et al.

(10) Patent No.: US 7,755,094 B2
(45) Date of Patent: Jul. 13, 2010

(54) SEMICONDUCTOR LIGHT EMITTING DEVICE AND METHOD OF MANUFACTURING THE SAME

(75) Inventors: Kyung Jun Kim, Gwangju (KR); Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/144,187

(22) Filed: Jun. 23, 2008

(65) Prior Publication Data
US 2008/0315222 A1 Dec. 25, 2008

(30) Foreign Application Priority Data
Jun. 22, 2007 (KR) .................. 10-2007-0061430

(51) Int. Cl.
*H01L 33/00* (2010.01)
*H01L 21/20* (2010.01)
(52) U.S. Cl. .................. 257/79; 257/94; 257/E33.025; 257/E21.09; 438/47
(58) Field of Classification Search .................. 257/79, 257/94, E33.025, E21.09; 438/47
See application file for complete search history.

(56) References Cited
U.S. PATENT DOCUMENTS
2007/0080352 A1* 4/2007 Wu et al. .................. 257/79

OTHER PUBLICATIONS
English translation of KR 2008022684 A.*
* cited by examiner

*Primary Examiner*—Victor A Mandala
*Assistant Examiner*—Whitney Moore
(74) *Attorney, Agent, or Firm*—Birch, Stewart, Kolasch & Birch, LLP

(57) ABSTRACT

A semiconductor light emitting device and a method of manufacturing the same are provided. The semiconductor light emitting device comprises a substrate, a mask seed layer formed on the substrate and comprising a II group element, a nitride layer formed on the mask seed layer and comprising a III group element, a first conductive semiconductor layer on the nitride layer, an active layer on the first conductive layer, and a second conducive semiconductor layer on the active layer.

19 Claims, 5 Drawing Sheets

SEMICONDUCTOR LIGHT EMITTING DEVICE AND METHOD OF MANUFACTURING THE SAME

CROSS-REFERENCE TO RELATED APPLICATIONS

The present application claims priority under 35 U.S.C. 126 and 35 U.S.C. 365 to Korean Patent Application No. 10-2007-0061430 (filed on Jun. 22, 2007), which is hereby incorporated by reference in its entirety.

BACKGROUND

The present disclosure relates a semiconductor light emitting device and a method of manufacturing the same.

A III-V group nitride semiconductor has been variously used for an optical device such as blue/green LEDs (light emitting diodes), a high speed switching device such as a MOSFET (metal semiconductor field effect transistor) and a HEMT (hetero junction field effect transistor), a light source of an illumination or a display apparatus, and the like. In particular, a light emitting device using an III group nitride semiconductor has a direct transition-type bandgap corresponding to the range of visible rays to ultraviolet rays, and can perform high efficient light emission.

The nitride semiconductor has been mainly utilized as a LED or a LD (laser diode), and research for improving the manufacturing process or light efficiency had been conducted.

SUMMARY

Embodiments provide a semiconductor light emitting device that can form a high crystalline mask layer under a first conductive semiconductor layer and a method of manufacturing the semiconductor light emitting device.

Embodiment provide a semiconductor light emitting device that is designed to grow a high crystalline thin film by forming a mask seed layer using a II group element and forming a III group nitride thin film around the mask seed layer and a method of manufacturing the semiconductor light emitting device.

An embodiment provides the semiconductor light emitting device comprising; a substrate, a mask seed layer on the substrate and comprising a II group element, a nitride layer on the mask seed layer and comprising a III group element, a first conductive semiconductor layer on the nitride layer, an active layer on the first conductive layer, and a second conductive semiconductor layer on the active layer.

An embodiment provides a semiconductor light emitting device comprising; a mask seed layer, a first nitride layer between the mask seed layer, a second nitride layer on the mask seed layer and the first nitride layer, a first conductive semiconductor layer on the second nitride layer, an active layer on the first conductive semiconductor layer, and a second conductive semiconductor layer on the active layer.

An embodiment provides a method of manufacturing a semiconductor light emitting device comprising; forming a mask seed layer on a substrate, the mask seed layer comprising a II group element; forming a nitride layer on the mask seed layer, the nitride layer; forming a first conductive semiconductor layer on the nitride layer; forming an active layer on the first conductive semiconductor layer; and forming a second conductive semiconductor layer on the active layer.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In the following description, words "above," "one," "below," and "underneath" are based on the accompanying drawings. In addition, a thickness of each layer is only exemplarily illustrated.

Figure 1:
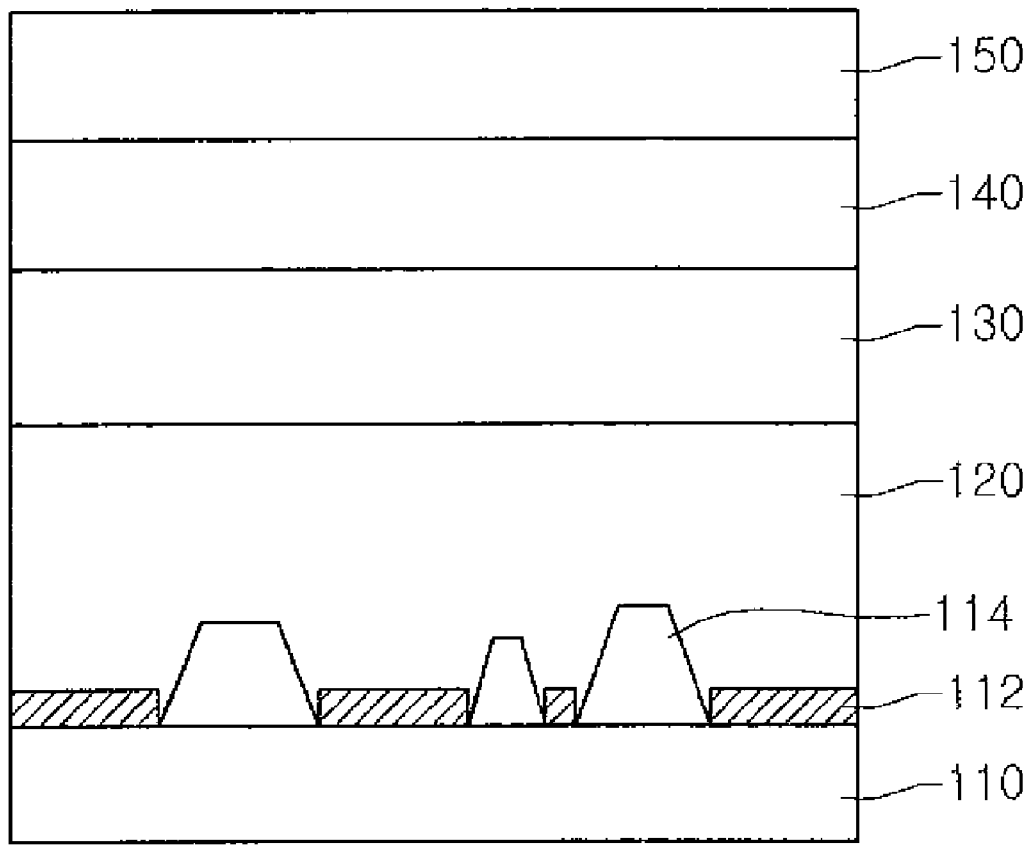
FIG. 1 is a side sectional view of a semiconductor light emitting device according to an embodiment.

FIG. 1 is a side sectional view of a semiconductor light emitting device according to an embodiment.

Referring to FIG. 1, the semiconductor light emitting device 100 comprises a substrate 110, a mask seed layer 112, a first nitride layer 114, a second nitride layer 120, a first conductive semiconductor layer 130, an active layer 140, and a second conductive semiconductor layer 150.

The substrate 110 may be formed of a material selected from the group consisting of a sapphire ($Al_2O_3$), SiC, Si, GaAs, GaN, ZnO, Si, GaP, InP, Ge, and a combination thereof. The substrate 110 may have a conductive property.

The mask seed layer 112 and the first nitride layer 114 are formed on the substrate 110. Here, the mask seed layer 112 and the first nitride layer 114 may be directly formed on the substrate 110. Alternatively, a buffer layer is formed on the substrate 110 and the mask seed layer 112 and the first nitride layer 114 are formed on the buffer layer. However, the present disclosure is not limited to these configurations.

The mask seed layer 112 is randomly formed on the substrate 110. The mask seed layer 112 is a layer formed by binding a II group element with nitride. The mask seed layer 112 functions as a buffer.

The mask seed layer 112 may be formed by binding one of the II group elements Mg, Be, and Zn with the nitride, i.e., formed of at least one of MgN, BeN, and ZnN. For example, the mask seed layer 112 may be formed of the MgN. The mask seed layer 112 may be formed with a thickness of, for example, 10-1000 Å. The mask seed layer 112 is formed on the substrate 110 with a random size or/and a random shape.

The first nitride layer 114 is formed on portions of the substrate 110, where the mask seed layer 112 is not formed. Here, the first nitride layer 114 is formed on the portions after the mask seed layer 112 is formed. That is, a semiconductor material of the first nitride layer 114 has an inferior wetting property with the mask seed layer 112 and thus the first nitride layer 114 may not be grown on the mask seed layer 112. That is, the mask seed layer 112 functions as a mask for the first nitride layer 114.

The first nitride layer 114 is formed of a III group nitride thin film that is formed by combining at least one of III group elements Ga, Al, and In with the nitride. That is, the first nitride layer 114 may be one of GaN, InN, InGaN, AlGaN, InAlGaN, and undoped GaN layers. In addition, the first nitride layer 114 may comprise or may not comprise first conductive dopants.

The first nitride layer 114 may be provided in the form of an island having a polygonal section such as a triangular section, a rectangular section, and a trapezoidal section, a cone-shaped section, or a column-shaped section. In addition, a top shape of the first nitride layer 114 may be formed in a polygonal shape.

The first nitride layer 114 may be thicker than the mask seed layer 112.

A second nitride layer 120 is formed on the mask seed layer 112 and the first nitride layer 114. The second nitride layer 120 is formed of a III group nitride thin film that is formed by combining at least one of III group elements Ga, Al, and In with the nitride. That is, the second nitride layer 120 may be one of GaN, InN, InGaN, AlGaN, InAlGaN, and undoped GaN layers. In addition, the second nitride layer 120 may comprise or may not comprise first conductive dopants.

The second nitride layer 120 may be higher than the highest island of the first nitride layer 114. The second nitride layer 120 has a planarized surface by coalescence at a thickness higher than a predetermined level. The second nitride layer 120 may be formed to have a thickness of 0.1~4 um.

The second nitride layer 120 is formed with a predetermined thickness on the mask seed layer 112 and the first nitride layer 114 to provide a crystalline thin film.

The first conductive semiconductor layer 130 is formed on the second nitride layer 120. The first conductive semiconductor layer 130 is an n-type semiconductor layer doped with n-type dopants. The first conductive semiconductor layer 130 may comprise at least one n-type semiconductor layer that is formed of a material selected from the group consisting of GaN, InN, AlN, InGaN, AlGaN, InAlGaN, and AlInN. The n-type dopants may be selected from the group consisting of Si, Ge, Sn, Se, Te, and a combination thereof.

The active layer 140 is formed on the first conductive semiconductor layer 130. The active layer 140 is formed in a single quantum well structure or a multi-quantum well structure. The active layer 140 has one or more quantum well layers formed of InGaN and one or more quantum barrier layers formed of GaN. The quantum well layers and the quantum barrier layers are alternately formed. P-type and n-type clad layers may be respectively formed on and underneath the active layers 140.

The second conductive semiconductor layer 150 is formed on the active layer 140. The second conductive semiconductor layer 150 is a p-type semiconductor layer 150 doped with p-type dopants. That is, the second conductive semiconductor layer 150 comprises at least one p-type semiconductor layer formed of a compound material selected from the group consisting of GaN, InN, AlN, InGaN, AlGaN, InAlGaN, and AlInN. The p-type dopants may be selected from the group consisting of Mg, Zn, Ga, Sr, Ba, and a combination thereof.

A transparent electrode layer (not shown) may be formed on the second conductive semiconductor layer 150. The transparent electrode layer may be formed of a material selected from the group consisting of ITO, ZnO, IrOx, RuOx, and NiO. In the semiconductor light emitting device 100 of the embodiment, the first conductive semiconductor layer 130 is the n-type semiconductor layer and the second conductive semiconductor layer 150 is the p-type semiconductor layer. However, the present disclosure is not limited to this configuration. That is, the first conductive semiconductor layer 130 may be the p-type semiconductor layer and the second conductive semiconductor layer 150 may be the n-type semiconductor layer. In addition, the n-type or p-type semiconductor layer may be further formed on the second conductive semiconductor layer 150. Therefore, the semiconductor light emitting device 100 may be formed in an n-p junction structure, a p-n junction structure, an n-p-n junction structure, or a p-n-p junction structure.

Figure 2:
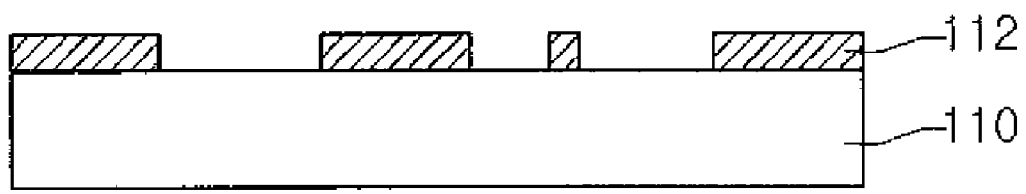
FIGS. 2 to 4 are side sectional views illustrating a process for manufacturing a semiconductor light emitting device according to an embodiment.
Figure 3:
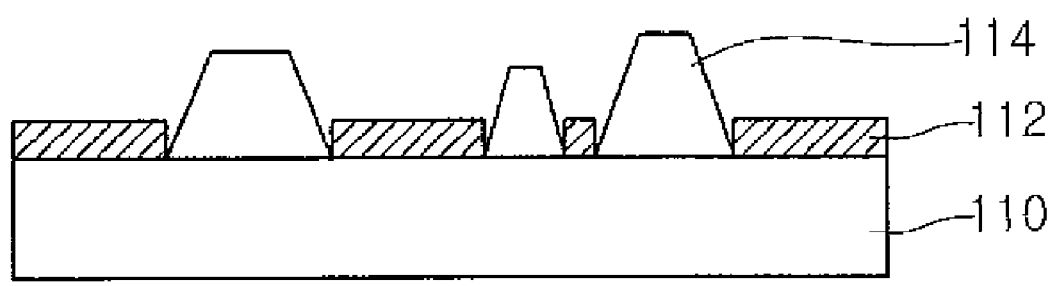
Figure 4:
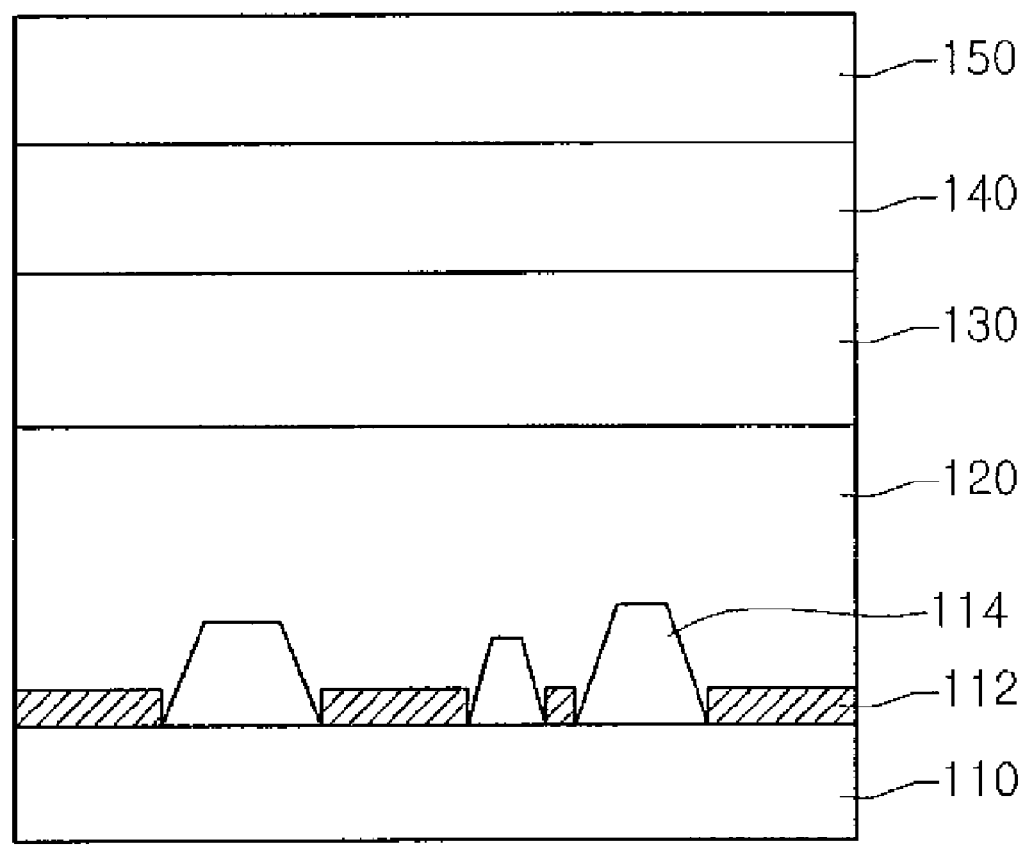

FIGS. 2 to 4 are side sectional views illustrating a process for manufacturing a semiconductor light emitting device according to an embodiment.

Referring to FIG. 2, a nitride thin film is grown on the substrate 110 by an electron beam deposition device, a physical vapor deposition (PVD) device, a chemical vapor deposition (CVD) device, a plasma laser deposition (PLD) device, a dual-type thermal evaporator, a sputtering device, or a metal organic chemical vapor deposition device. However, the devices are limited to these.

The substrate 111 may be formed of a material selected from the group consisting of a sapphire (Al2O3), SiC, Si, GaAs, GaN, ZnO, Si, GaP, InP, Ge, and a combination thereof. The substrate 110 may have a conductive property.

The mask seed layer 112 is formed on the substrate 110. The mask seed layer 112 is loaded on the substrate 110 by a growing device and heat-treated at a temperature of 1000-1200° C., after which the mask seed layer 112 is nitridation-processed using ammonia (NH3) at a temperature of 500-1100° C. At this point, the II group element is supplied to form a layer formed by a combination of the II group element and the nitride. The mask seed layer 112 may be formed of, for example, MgN. That is, the MgN functions as the mask. Alternatively, the mask seed layer 112 may be formed of BeN or ZnN. However, the material of the mask seed layer 112 is not specifically limited.

The mask seed layer 112 may be formed to have a thickness of, for example, 10-1000 Å. The mask seed layer 112 is formed on the top surface of the substrate 110 with a random size or/and a random shape. The mask seed layer 112 functions to mask threading dislocations from the substrate 110.

Referring to FIG. 3, when the mask seed layer 112 is formed, the first nitride layer 114 is formed between the mask seed layer 112. The first nitride layer 114 protrudes in the form of the island on portions where the mask seed layer 112 is not formed.

The first nitride layer 114 is formed using the III group element and the nitride. At this point, since the first nitride layer 114 uses the III group element, it has an interior wetting property with the mask seed layer 112 that is formed using the II group element and thus the first nitride layer 114 is not grown on the surface of the mask seed layer 112 but is formed in the form of the island between the mask seed layer 112.

The first nitride layer 114 is formed of a combination of at least one of the III group elements such as Ga, In, and Al and the ammonia (NH3). The first nitride layer 114 may be grown at a growing temperature of 500-1100° C. for 1-30 minutes. The first nitride layer 114 may be one of GaN, InN, InGaN, AlGaN, InAlGaN, and undoped GaN layers. The first nitride layer may comprise or may not comprise first conductive dopants.

The first nitride layer 114 may be provided in the form of an island having a polygonal section such as a triangular section, a rectangular section, and a trapezoidal section, a cone-shaped section, or a column-shaped section. In addition, a top shape of the first nitride layer 114 may be formed in a polygonal shape. The first nitride layer 114 may be thicker than the mask seed layer 112.

Referring to FIG. 4, the second nitride layer 120 is formed on the mask seed layer 112 and the first nitride layer 114. The second nitride layer 120 is formed of a combination of the III group element and the nitride. For example, the second nitride layer 120 may be one of GaN, InN, InGaN, AlGaN, InAlGaN, and undoped GaN layers. The second nitride layer 120 may comprise or may not comprise first conductive dopants.

The second nitride layer 120 is grown at a growing temperature of 500-1300° C. for a predetermined time by supplying at least one of the III group elements such as Ga, Al, and In and the ammonia.

The growing of the second nitride layer 120 starts at a temperature higher than a temperature at which the first nitride layer 114 is grown, after which the growing temperature of the second nitride layer gradually increases. The second nitride layer 120 is coalesced at a thickness higher than a predetermined level and is subsequently planarized. That is, the second nitride layer 120 is coalesced and processed to have a planarized surface. The second nitride layer 120 may be higher than the highest island of the first nitride layer 114. The second nitride layer 120 may be formed to have a thickness of 0.1~4 um.

The second nitride layer 120 can reduce a density of the threading dislocations and thus can be improved in the crystalline property.

The first conductive semiconductor layer 130 is formed on the second nitride layer 120. The first conductive semiconductor layer 130 is the n-type semiconductor layer that is formed of a material selected from the group consisting of GaN, InN, AlN, InGaN, AlGaN, InAlGaN, and AlInN. The n-type dopants may be selected from the group consisting of Si, Ge, Sn, Se, Te, and a combination thereof.

The active layer 140 is formed on the first conductive semiconductor layer 130. The active layer 140 is formed in a single quantum well structure or a multi-quantum well structure. The active layer 140 has one or more quantum well layers formed of InGaN and one or more quantum barrier layers formed of GaN. The quantum well layers and the quantum barrier layers are alternately formed. P-type and n-type clad layers may be respectively formed on and underneath the active layers 140.

The second conductive semiconductor layer 150 is formed on the active layer 140. The second conductive semiconductor layer 150 is a p-type semiconductor layer 150 doped with p-type dopants. The second conductive semiconductor layer 150 is formed on the active layer 140. That is, the second conductive semiconductor layer 150 comprises at least one p-type semiconductor layer formed of a compound material selected from the group consisting of GaN, InN, AlN, InGaN, AlGaN, InAlGaN, and AlInN. The p-type dopants may be selected from the group consisting of Mg, Zn, Ga, Sr, Ba, and a combination thereof.

In the semiconductor light emitting device 100 of the embodiment, the first conductive semiconductor layer 130 is the n-type semiconductor layer and the second conductive semiconductor layer 150 is the p-type semiconductor layer. However, the present disclosure is not limited to this configuration. That is, the first conductive semiconductor layer 130 may be the p-type semiconductor layer and the second conductive semiconductor layer 150 may be the n-type semiconductor layer. In addition, the n-type or p-type semiconductor layer may be further formed on the second conductive semiconductor layer 150. Therefore, the semiconductor light emitting device 100 may be formed in an n-p junction structure, a p-n junction structure, an n-p-n junction structure, or a p-n-p junction structure.

Figure 5:
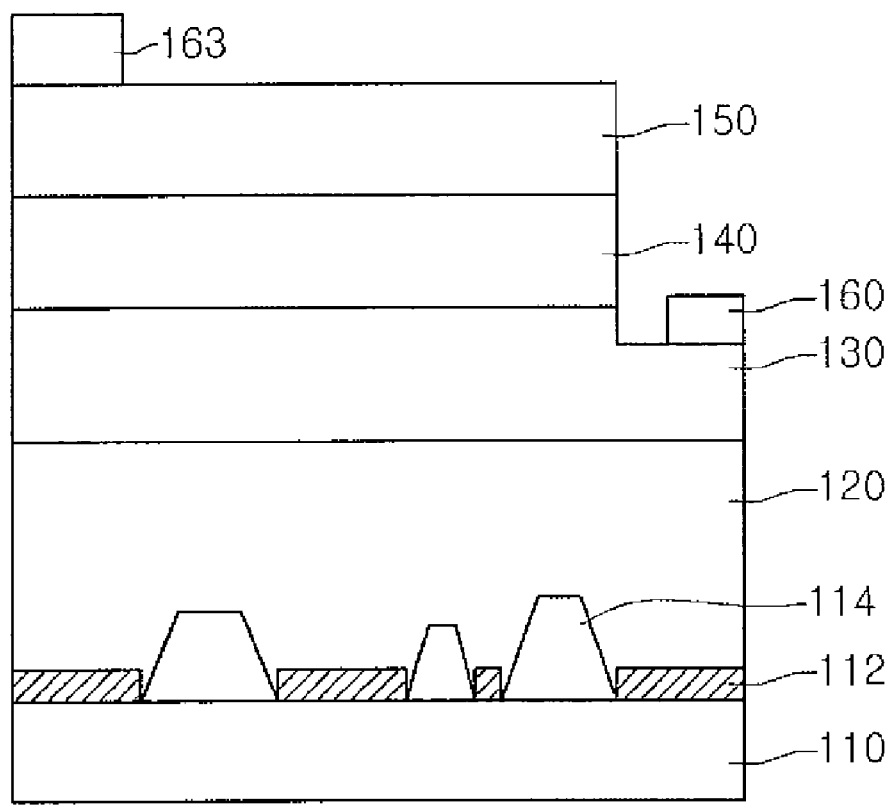
FIG. 5 is a view of an example of an electrode of the semiconductor light emitting device of FIG. 1.

FIG. 5 is a view of an example of an electrode of the semiconductor light emitting device of FIG. 1.

Referring to FIG. 5, a horizontal type semiconductor light emitting device 100A further comprises a first electrode 160 formed on the first conductive semiconductor layer 130 and a second electrode 163 formed on the second conductive semiconductor layer 150.

Here, a transparent electrode layer (not shown) may be formed on the second conductive semiconductor layer 150. The transparent electrode layer may be formed of a material selected from the group consisting of ITO, ZnO, IrOx, RuOx, and NiO.

In addition, a vertical semiconductor light emitting device may be realized using FIG. 1. For example, a reflective electrode layer (not shown) and a conductive supporting substrate (not shown) are formed on the second conductive semiconductor layer 150, after which the substrate (100 in FIG. 1) is removed through a laser lift off (LLO) process. Subsequently, a first electrode may be formed by exposing an undersurface of the first conductive semiconductor layer 130. At this point, at least one of the mask seed layer 112, first nitride layer 114, and second nitride layer 120 may not be removed in accordance with electrical properties thereof and the first electrode may be formed on the layer that is not removed. Alternatively, only the mask seed layer 112 or/and the first nitride layer 114 may be removed. In this case, a boundary surface pattern may exist under the second nitride layer 114 as a result of the removal of the mask seed layer 112 or/and the first nitride layer 114.

In the above description, it will be understood that when a layer (or film) is referred to as being 'on' another layer or substrate, it can be directly on the another layer or substrate, or intervening layers may also be present. Further, it will be understood that when a layer is referred to as being 'under' another layer, it can be directly under the another layer, and one or more intervening layers may also be present. In addition, it will also be understood that when a layer is referred to as being 'between' two layers, it can be the only layer between the two layers, or one or more intervening layers may also be present.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
a substrate; a mask seed layer on the substrate and comprising BeN; a nitride layer on the mask seed layer and comprising a III group element; a first conductive semiconductor layer on the nitride layer; an active layer on the first conductive layer; and a second conductive semiconductor layer on the active layer.

2. The semiconductor light emitting device according to claim 1, wherein the nitride layer comprises at least one of Ga, Al, and In that are the III group elements and nitride.

3. The semiconductor light emitting device according to claim 1, wherein the nitride layer comprises a first nitride layer between the mask seed layer and a second nitride layer on the mask seed layer and the first nitride layer.

4. The semiconductor light emitting device according to claim 3, wherein each of the first and second nitride layers is one of GaN, InN, InGaN, AlGaN, InAlGaN, and undoped GaN layers.

5. The semiconductor light emitting device according to claim 3, wherein the mask seed layer is formed with a random size and shape and the first nitride layer is formed with an island shape between the mask seed layer.

6. The semiconductor light emitting device according to claim 3, wherein a surface of the second nitride layer is planarized.

7. The semiconductor light emitting device according to claim 3, wherein the second nitride layer is formed to have a thickness of 0.1-4 μm.

8. The semiconductor light emitting device according to claim 1, comprising a buffer layer between the mask seed layer and the substrate.

9. The semiconductor light emitting device according to claim 1, comprising one of n-type and p-type semiconductor layers on the second conductive semiconductor layer.

10. A semiconductor light emitting device comprising:
a mask seed layer including BeN; a first nitride layer between the mask seed layer;
a second nitride layer on the mask seed layer and the first nitride layer; a first conductive semiconductor layer on the second nitride layer; an active layer on the first conductive semiconductor layer; and a second conductive semiconductor layer on the active layer.

11. The semiconductor light emitting device according to claim 10, wherein the mask seed layer is formed with a random size.

12. The semiconductor light emitting device according to claim 10, wherein each of the first and second nitride layers comprises at least one of Ga, In, and Al that are the III group elements and nitride.

13. The semiconductor light emitting device according to claim 10, wherein the mask seed layer has a thickness of 10-1000 Å.

14. The semiconductor light emitting device according to claim 10, comprising at least one of a buffer layer and a substrate under the mask seed layer and the first nitride layer.

15. The semiconductor light emitting device according to claim 10, wherein the first nitride layer is thicker than the mask seed layer and the second nitride layer is thicker than the first nitride layer.

16. A semiconductor light emitting device comprising:
a mask seed layer comprising BeN; a first conductive semiconductor layer on the mask seed layer and comprising a recess formed in the form of an island; an active layer on the first conductive semiconductor layer; and a second conductive semiconductor layer on the active layer.

17. The semiconductor light emitting device according to claim 16, wherein the first conductive semiconductor layer comprises at least one of an undoped semiconductor layer, an n-type semiconductor, and a p-type semiconductor.

18. The semiconductor light emitting device according to claim 16, wherein the first conductive semiconductor layer comprises one of GaN, InN, InGaN, AlGaN, and InAlGaN.

19. The semiconductor light emitting device according to claim 16, wherein the recess formed in the form of an island is formed with a random size and shape.

* * * * *